United States Patent
Yen et al.

(10) Patent No.: US 10,454,461 B1
(45) Date of Patent: Oct. 22, 2019

(54) FREQUENCY COMPENSATION CIRCUIT USED IN DC VOLTAGE CONVERTER

(71) Applicant: ANPEC ELECTRONICS CORPORATION, Hsinchu (TW)

(72) Inventors: Tzu-Yang Yen, Taipei (TW); Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/103,966

(22) Filed: Aug. 16, 2018

(30) Foreign Application Priority Data

May 23, 2018 (TW) .............................. 107117515 A (51) Int. Cl.
  *H03K 5/00* (2006.01)
  *H03K 3/037* (2006.01)
  *H03K 5/24* (2006.01)
  *H02M 1/08* (2006.01)
  *H03K 19/20* (2006.01)

(52) U.S. Cl.
  CPC .......... *H03K 5/00006* (2013.01); *H02M 1/08* (2013.01); *H03K 3/037* (2013.01); *H03K 5/24* (2013.01); *H03K 19/20* (2013.01)

(58) Field of Classification Search
  CPC ...... H03K 5/00006; H03K 5/24; H03K 3/037; H03K 19/20; H02M 1/08
  USPC .......................................................... 327/114
  See application file for complete search history.

(56) References Cited

U.S. PATENT DOCUMENTS

| | | | | |
|---|---|---|---|---|
| 7,521,913 B2* | 4/2009 | Tang | .................... | H02M 3/1584 323/272 |
| 8,441,238 B2* | 5/2013 | Chen | .................... | H02M 3/1588 323/222 |
| 9,369,044 B2* | 6/2016 | Teh | ...................... | H02M 3/1584 |
| 9,800,131 B1* | 10/2017 | Chen | ..................... | H02M 1/084 |
| 2003/0081438 A1* | 5/2003 | Dinh | ........................ | H02J 1/102 363/127 |
| 2008/0030178 A1* | 2/2008 | Leonard | ................ | H02M 3/156 323/282 |
| 2008/0298106 A1* | 12/2008 | Tateishi | .............. | H02M 3/1588 363/127 |
| 2016/0308441 A1* | 10/2016 | Chen | ..................... | H02M 3/158 |

* cited by examiner

*Primary Examiner* — Ryan Jager
(74) *Attorney, Agent, or Firm* — Li & Cai Intellectual Property (USA) Office (57) ABSTRACT

A frequency compensation circuit includes a compensation circuit and a calculation circuit. The compensation circuit controls the calculation circuit to generate a ramp voltage when the voltage at a node between an upper-side switch and a lower-side switch of the DC voltage converter is larger than an input voltage of the DC voltage converter. The calculation circuit generates a control signal at low level when the ramp voltage is smaller than the output voltage of the DC voltage converter so that the frequency compensation circuit generates the constant on-time signal at high level. The calculation generates the control signal at high level when the ramp voltage is larger than or equal to the output voltage of the DC voltage converter so that the frequency compensation circuit generates the constant on-time signal at low level.

10 Claims, 7 Drawing Sheets

FREQUENCY COMPENSATION CIRCUIT USED IN DC VOLTAGE CONVERTER

FIELD OF THE DISCLOSURE

The present disclosure relates to a frequency compensation circuit used in a DC voltage converter, and more particularly to a frequency compensation circuit that can maintain the switching frequency of a DC voltage converter.

BACKGROUND OF THE DISCLOSURE

DC voltage converters have been widely used in kinds of industrial products and consumer products. Generally, the DC voltage converter is used to convert a high input voltage into a low output voltage which meets the requirements of circuit designs. There are three kinds of feedback control circuit designs of the DC voltage converter, which are the voltage mode, the current mode and the constant on time mode, respectively.

Conventionally, the circuit design of the constant on time mode is often used. Compared with the circuit designs of the voltage mode and the current mode, the switching efficiency of the upper-side switch and the lower-side switch is not determined by a clock generator in the circuit design of the constant on time mode. Instead, an on-time generator is used to generate a control signal, and the system end will accordingly adjust the switching efficiency of the upper-side switch and the lower-side switch.

Figure 1:
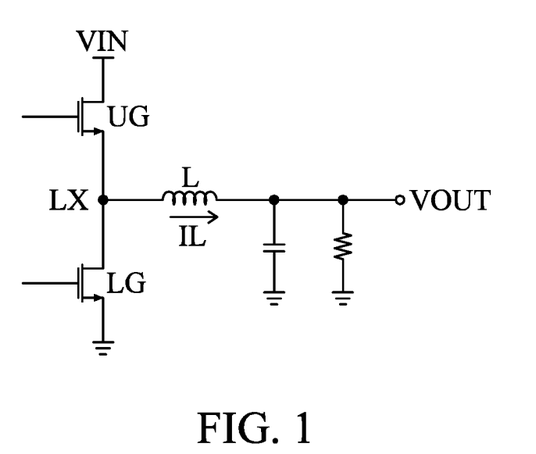
FIG. 1 is a circuit diagram of a switching DC voltage converter.
Figure 2A:
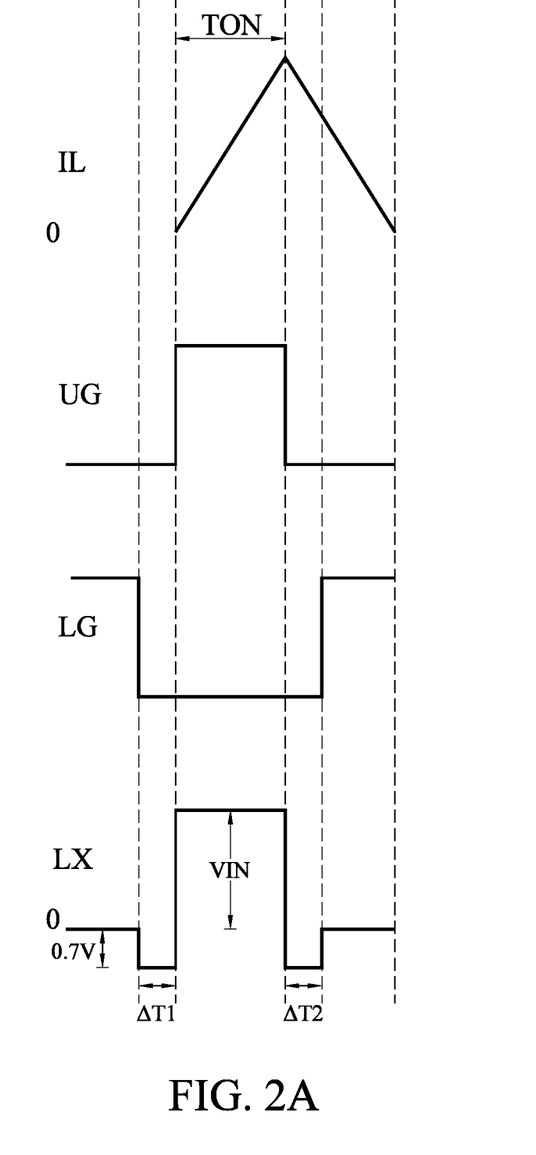
FIG. 2A, FIG. 2B and FIG. 2C are waveform diagrams showing the operation of the switching DC voltage converter in FIG. 1.
Figure 2B:
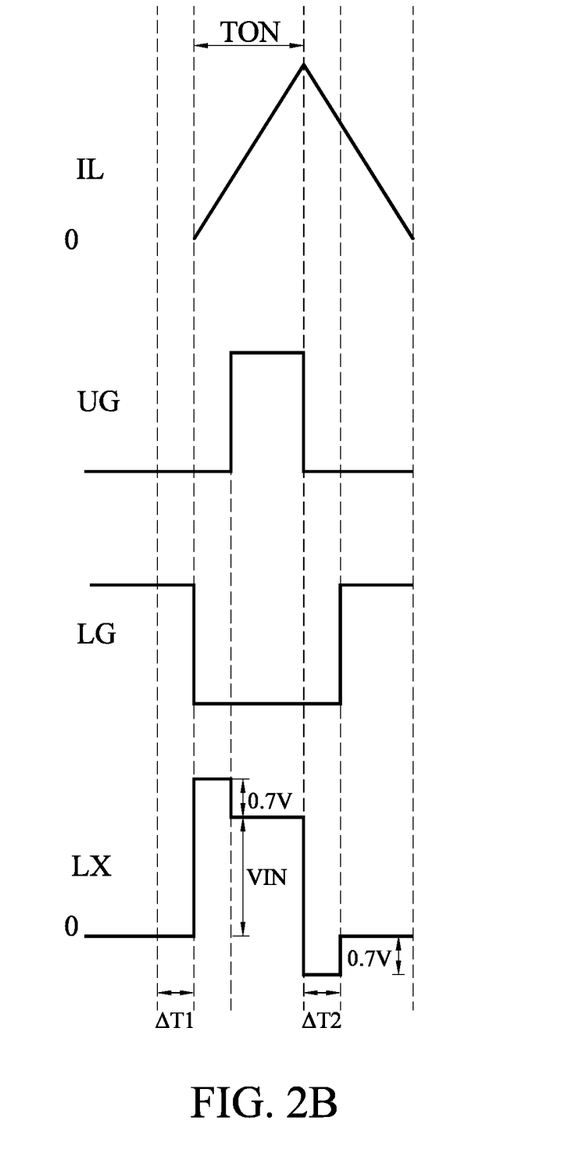
Figure 2C:
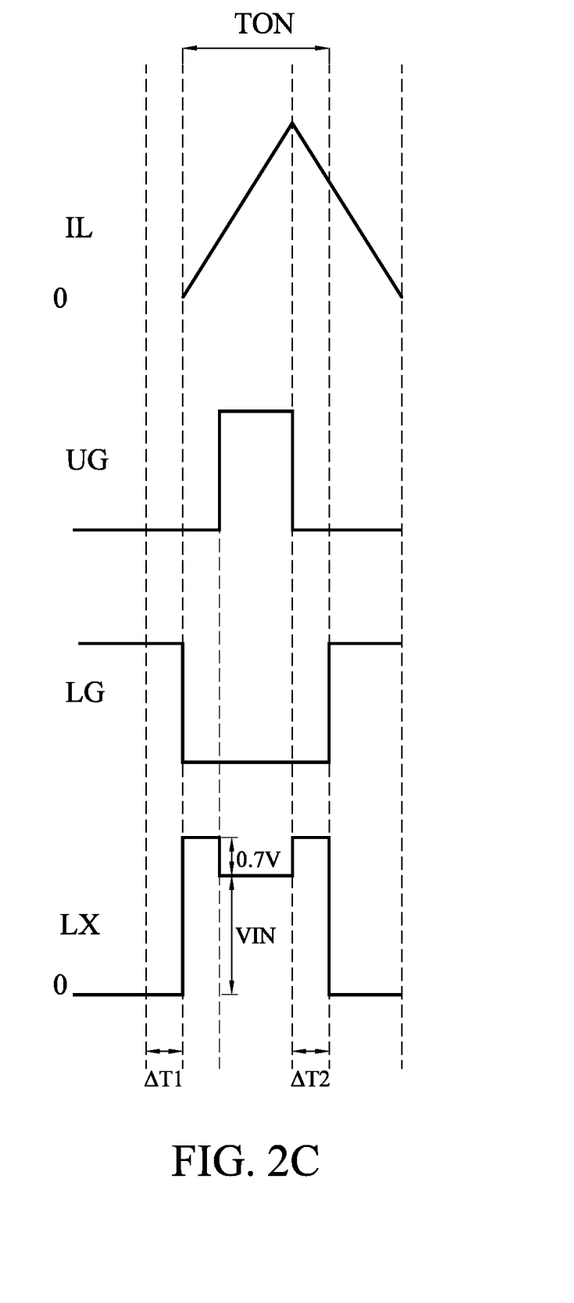

FIG. 1 is a circuit diagram of a switching DC voltage converter. FIG. 2A, FIG. 2B and FIG. 2C are waveform diagrams showing the operation of the switching DC voltage converter in FIG. 1.

As shown in FIG. 1, when an upper-side switch UG is turned on and a lower-side switch LG is turned off, a current IL flows from the upper-side switch UG to an inductor L. As a result, the current IL flowing through the inductor L increases. On the other hand, when the upper-side switch UG is turned off and the lower-side switch LG is turned on, the current IL flows from the inductor L to the lower-side switch LG. As a result, the current IL flowing through the inductor L decreases. In addition, to prevent the upper-side switch UG and the lower-side switch LG from being turned on simultaneously, a dead time will be applied when controlling the turning on and turning off of the UG and LG.

As shown in FIG. 2A, when the current IL flowing through the inductor L is positive, during a dead time ΔT1 when the lower-side switch LG is turned off but the upper-side switch UG has not yet been turned on, and within a dead time ΔT2 when lower-side switch LG has not yet been turned on but the upper-side switch UG is turned off, the current IL flows from the inductor L and through a body diode of the lower-side switch LG. Therefore, a voltage at a node LX will be −0.7V if the turn-on voltage of the body diode of the lower-side switch LG is 0.7V. Also, the voltage at the node LX will be an input voltage VIN of the switching DC voltage converter when the lower-side switch LG is turned off and the upper-side switch UG is turned on. In this case, an equivalent on-time ton of the switching DC voltage converter is equal to an on-time of the upper-side switch UG.

As shown in FIG. 2B, when the current IL flowing through the inductor L is partially negative, within the dead time ΔT1 when the lower-side switch LG is turned off but the upper-side switch UG has not yet been turned on, the current IL flows from the inductor L and through the body diode of the upper-side switch UG since the current IL flowing through the inductor L is negative. Therefore, the voltage at the node LX will be the input voltage VIN of the switching DC voltage converter plus 0.7V if the turn-on voltage of the body diode of the lower-side switch LG is 0.7V. The on-time of the upper-side switch UG in FIG. 2A is equal to the on-time of the upper-side switch UG in FIG. 2B, but the equivalent on-time ton (i.e., the time duration when the voltage at the node LX is at high level) of the switching DC voltage converter in FIG. 2B is longer than the equivalent on-time ton of the switching DC voltage converter in FIG. 2A by a dead time ΔT1.

As shown in FIG. 2C, when the current IL flowing through the inductor L is entirely negative, within the dead time ΔT2 when lower-side switch LG has not yet been turned on but the upper-side switch UG is turned off, the current IL flows from the inductor L and through the body diode of the upper-side switch UG since the current IL flowing through the inductor L is negative. According to FIG. 2A and FIG. 2C, the on-time of the upper-side switch UG in FIG. 2A is equal to the on-time of the upper-side switch UG in FIG. 2C, but the equivalent on-time ton of the switching DC voltage converter in FIG. 2C is longer than the equivalent on-time ton (i.e., the time duration when the voltage at the node LX is at high level) of the switching DC voltage converter in FIG. 2A by a dead time ΔT1 and a dead time ΔT2.

According the above described operation of the switching DC voltage converter using a feedback control circuit with the constant on time mode circuit design, when the current IL flowing through the inductor L is partially or entirely negative, the equivalent on-time ton of the switching DC voltage converter is longer, which decreases the switching frequency of the switching DC voltage converter.

SUMMARY OF THE DISCLOSURE

In response to the above-referenced technical inadequacies, the present disclosure provides a frequency compensation circuit that can generate a constant on-time signal to a DC voltage converter to maintain the switching frequency of an upper-side switch and a lower-side switch of the DC voltage converter.

In one aspect, the frequency compensation circuit provided by the present disclosure includes a calculation circuit and a compensation circuit. The calculation circuit is coupled to the DC voltage converter, and the compensation circuit is coupled to the calculation circuit and the DC voltage converter. The compensation circuit detects the voltage at a node between an upper-side switch and a lower-side switch of the DC voltage converter, and then according to the voltage at the node and an input voltage of the DC voltage converter controls the calculation circuit to generate a ramp voltage. After that, the calculation circuit generates a control signal according to the ramp voltage and an output voltage of the DC voltage converter, such that a constant on-time signal is generated according to the control signal.

When the voltage at the node is larger than the input voltage of the DC voltage converter, the compensation circuit controls the calculation circuit to generate the ramp voltage. When the ramp voltage is smaller than the output voltage of the DC voltage converter, the calculation circuit generates the control signal at low level, and the frequency compensation circuit generates the constant on-time signal at high level according to the control signal at low level. On the other hand, when the ramp voltage is larger than or equal to the output voltage of the DC voltage converter, the calculation generates the control signal at high level, and the frequency compensation circuit generates the constant on-time signal at low level according to the control signal at high level.

Therefore, with the operation of the frequency compensation circuit, the switching frequency of a DC voltage converter can be maintained. When the current flowing through a inductor of the DC voltage converter is partially or entirely negative, the timing when the voltage of the constant on-time signal varies from a low voltage to a high voltage will be earlier, and also the timing when the voltage of the constant on-time signal varies from a high voltage to a low voltage will be earlier.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The frequency compensation circuit of the present disclosure is used to generate a constant on-time signal to a DC voltage converter to maintain switching frequencies of an upper-side switch and a lower-side switch of the DC voltage converter. For example, the DC voltage converter can be the DC voltage converter shown in FIG. 1. In this example, the constant on-time signal that the frequency compensation circuit of the present disclosure provides is to maintain the switching frequency of an upper-side switch UG and a lower-side switch LG of the DC voltage converter.

First Embodiment

Figure 3:
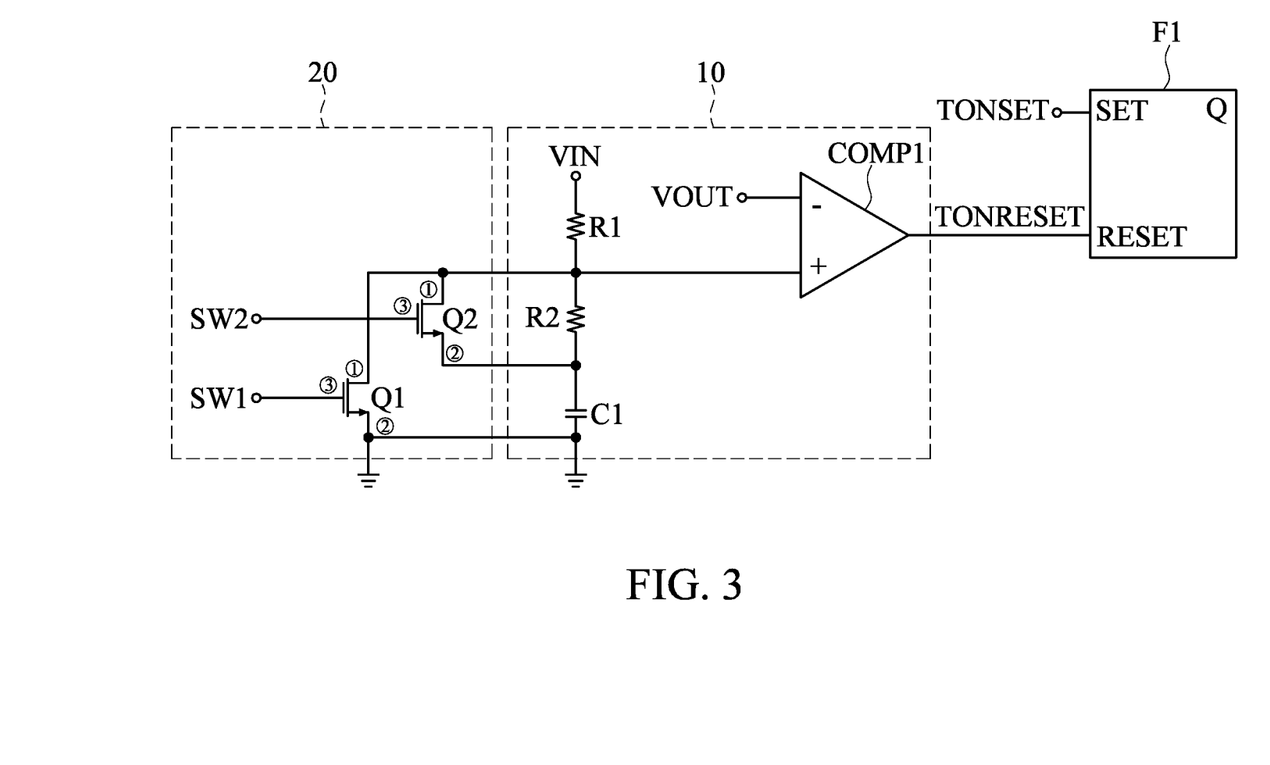
FIG. 3 is a circuit diagram of a frequency compensation circuit according to a first embodiment of the present disclosure.

Referring to FIG. 3, a first embodiment of the present disclosure provides a frequency compensation circuit.

As shown in FIG. 3, the frequency compensation circuit includes a calculation circuit 10 and a compensation circuit 20. The calculation circuit 10 is coupled to a DC voltage converter, and the compensation circuit 20 is coupled to the calculation circuit 10 and the DC voltage converter. With the operation of the compensation circuit 20, the calculation circuit 10 generates a constant on-time signal TON to the DC voltage converter to maintain the switching frequency of an upper-side switch and a lower-side switch of the DC voltage converter.

The working principle of the frequency compensation circuit is described as follows with reference to FIG. 1 and FIG. 3. The compensation circuit 20 detects a voltage at a node LX between the upper-side switch UG and the lower-side switch LG of the DC voltage converter, and according to the voltage at the node LX and an input voltage VIN of the DC voltage converter, controls the calculation circuit 10 to generate a ramp voltage RAMP. Then, the calculation circuit 10 generates a control signal according to the ramp voltage RAMP and an output voltage VOUT of the DC voltage converter, such that the constant on-time signal TON is provided to the DC voltage converter according to the control signal to maintain the switching frequency of the upper-side switch UG and the lower-side switch LG of the DC voltage converter.

The calculation circuit 10 includes a first resistor R1, a second resistor R2, a first capacitor C1 and a first comparator COMP1. One end of the first resistor R1 receives the input voltage VIN of the DC voltage converter, and the other end of the first resistor R1 is coupled to a non-inverting input end of the first comparator COMP1. An inverting input end of the first comparator COMP1 receives the output voltage VOUT of the DC voltage converter, and the control signal is outputted from an output end of the first comparator COMP1. One end of the first capacitor C1 is coupled to the other end of the first resistor R1, and the other end of the first capacitor C1 is grounded. The second resistor R2 is coupled between the first resistor R1 and the first capacitor C1.

The compensation circuit 20 includes a first transistor Q1 and a second transistor Q2. A first end of the first transistor Q1 is coupled to the non-inverting input end of the first comparator COMP1, and a second end of the first transistor Q1 is grounded. A first end of the second transistor Q2 is coupled to the non-inverting input end of the first comparator COMP1, and a second end of the second transistor Q2 is coupled between the second resistor R2 and the first capacitor C1.

For ease of illustration, in FIG. 3, the first ends of the first transistor Q1 and the second transistor Q2 are marked by ①, the second ends of the first transistor Q1 and the second transistor Q2 are marked by ②, and the control ends of the first transistor Q1 and the second transistor Q2 are marked by ③. For example, the first transistor Q1 and the second transistor Q2 are NMOS transistors, the first ends of the first transistor Q1 and the second transistor Q2 are drains, the second ends of the first transistor Q1 and the second transistor Q2 are sources, and the control ends of the first transistor Q1 and the second transistor Q2 are gates. However, the types of the first transistor Q1 and the second transistor Q2 are not restricted herein.

In this embodiment, the control end of the first transistor Q1 receives a first switching signal SW1 to control the turning on and turning off of the first transistor Q1, and the control end of the second transistor Q2 receives a second switching signal SW2 to control the turning on and turning off of the second transistor Q2. The first switching signal SW1 and the second switching signal SW2 are generated according to the voltage at the node LX and the input voltage VIN of the DC voltage converter (i.e., according to the fact that a current IL flowing through the inductor L is negative or not).

In the DC voltage converter, when the lower-side switch LG is turned off but the upper-side switch UG has not yet been turned on, if the voltage at the node LX is larger than or equal to the input voltage VIN of the DC voltage converter (i.e., if the current IL flowing through the inductor L is negative), according to FIG. 2B, an equivalent on-time ton should be counted at this moment. Therefore, the first transistor Q1 is turned off due to the first switching signal SW1 at low level, such that a current flows through the first resistor R1 and the second resistor R2 to charge the first capacitor C1. As a result, the ramp voltage RAMP can be generated earlier, and the equivalent on-time ton can also be counted earlier. When the ramp voltage RAMP has not yet been equal to the output voltage VOUT of the DC voltage converter, the first comparator COMP1 outputs a control signal at low level. As shown in FIG. 3, the control signal is used as a reset signal TONRESET of a flip-flop F1. Therefore, before the ramp voltage RAMP is equal to the output voltage VOUT of the DC voltage converter, the flip-flop F1 outputs the constant on-time signal TON at high level from its output pin Q.

On the other hand, when the upper-side switch UG is turned off but the lower-side switch LG has not yet been turned on, if the voltage at the node LX is still larger than or equal to the input voltage VIN of the DC voltage converter (i.e., if the current IL flowing through the inductor L is still negative), according to FIG. 2C, the equivalent on-time ton should end earlier at this moment. Therefore, the second transistor Q2 is turned off due to the second switching signal SW2 at low level. At the same time, the first capacitor C1 has been charged by the input voltage VIN and the voltage at the node LX is raised due to the second resistor R2, so that the ramp voltage RAMP achieves the output voltage of the DC voltage converter earlier and thus the equivalent on-time ton ends earlier. When the ramp voltage RAMP reaches the output voltage VOUT of the DC voltage converter, the first comparator COMP1 outputs a control signal at high level. As shown in FIG. 3, the control signal is used as the reset signal TONRESET of the flip-flop F1. According to the reset signal TONRESET at high level, the flip-flop F1 outputs the constant on-time signal TON at low level, which ends the equivalent on-time ton.

In the operation of the frequency compensation circuit in this embodiment, the ramp voltage RAMP can be generated earlier (or, the ramp voltage RAMP is generated earlier such that the ramp voltage RAMP can achieve the output voltage of the DC voltage converter earlier). As a result, the equivalent on-time ton will not be extended no matter whether the current IL flowing through the inductor L is partially or entirely negative.

Second Embodiment

Figure 4:
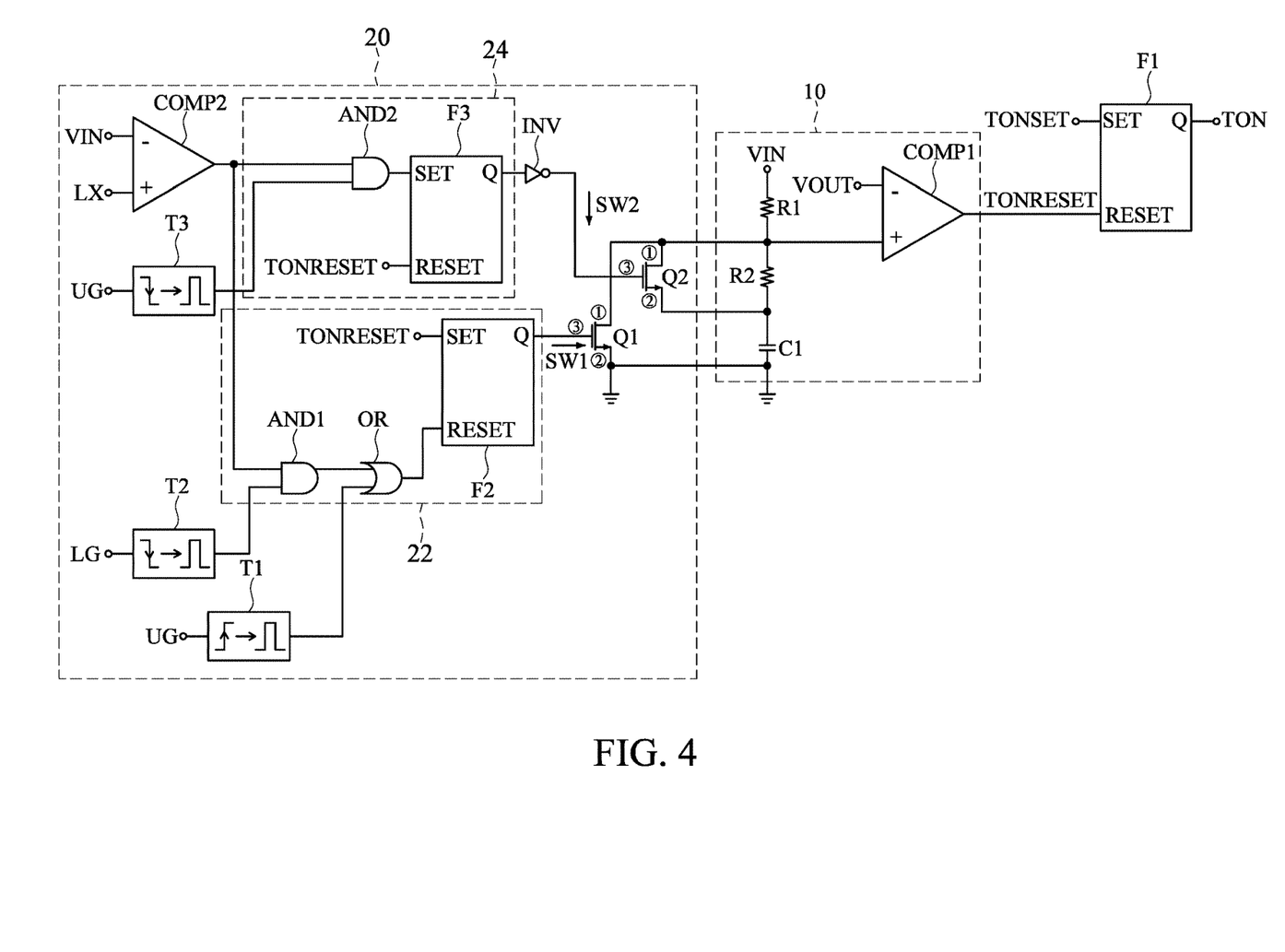
FIG. 4 is a circuit diagram of a frequency compensation circuit according to a second embodiment of the present disclosure.

Referring to FIG. 4, a second embodiment of the present disclosure provides a frequency compensation circuit.

The frequency compensation circuit in FIG. 4 and the frequency compensation circuit in FIG. 3 have similar circuit structures and working principles. However, as shown in FIG. 4, the compensation circuit 20 includes a first logic circuit 22 and a second logic circuit 24. According to the voltage at the node LX and the input voltage VIN of the DC voltage converter, the first logic circuit 22 generates the first switching signal SW1 and the second logic circuit 24 generates the second switching signal SW2. For ease of illustration, in FIG. 4, the first ends of the first transistor Q1 and the second transistor Q2 are marked by ①, the second ends of the first transistor Q1 and the second transistor Q2 are marked by ②, and the control ends of the first transistor Q1 and the second transistor Q2 are marked by ③.

The first logic circuit 22 includes a flip-flop F2, an OR gate OR and an AND gate AND1. An output pin of the flip-flop F2 is coupled to the control end of the first transistor Q1, and a set pin SET of the flip-flop F2 receives a reset signal TONRESET. An output end of the OR gate OR is coupled to a reset pin RESET of the flip-flop F2, and one input end of the OR gate OR is coupled to a first trigger circuit T1. An output end of the AND gate AND1 is coupled to the other input end of the OR gate, one input end of the AND gate AND1 is coupled to a second trigger circuit T2, and the other input end of the AND gate AND1 is coupled to an output end of the second comparator COMP2. In addition, the second logic circuit 24 includes a flip-flop F3 and an AND gate AND2. An output pin of the flip-flop F3 is coupled to the control end of the second transistor Q2 through an inverter INV, and a reset pin RESET of the flip-flop F3 receives a reset signal TONRESET. An output end of the AND gate AND2 is coupled to a set pin SET of the flip-flop F3, one input end of the AND gate AND2 is coupled to a third trigger circuit T3, and the other input end of the AND gate AND2 is coupled to the output end of the second comparator COMP2.

In this embodiment, the first trigger circuit T1 is designed to generate a pulse when the control voltage of the upper-side switch UG varies from a low voltage to a high voltage, the second trigger circuit T2 is designed to generate a pulse when a control voltage of the lower-side switch LG varies from a high voltage to a low voltage, and the third trigger circuit T3 is designed to generate a pulse when a control voltage of the upper-side switch UG varies from a high voltage to a low voltage. The inverting input end of the second comparator COMP2 receives the input voltage VIN of the DC voltage converter, and the non-inverting input end of the second comparator COMP2 receives the voltage at the node LX. According to FIG. 1, FIG. 2A and FIG. 4, generally, the voltage at the node LX is smaller than or equal to the input voltage VIN of the DC voltage converter (i.e., the current IL flowing through the inductor L is positive). Then, after a dead time ΔT1, a control voltage of the upper-side switch UG varies from a low voltage to a high voltage, such that the first trigger circuit T1 generates a pulse. Due to this pulse, the first transistor Q1 is turned off, and the calculation circuit 10 starts to generate the ramp voltage RAMP. In this case, the equivalent on-time ton is equal to the on-time of the upper-side switch UG.

Figure 5:
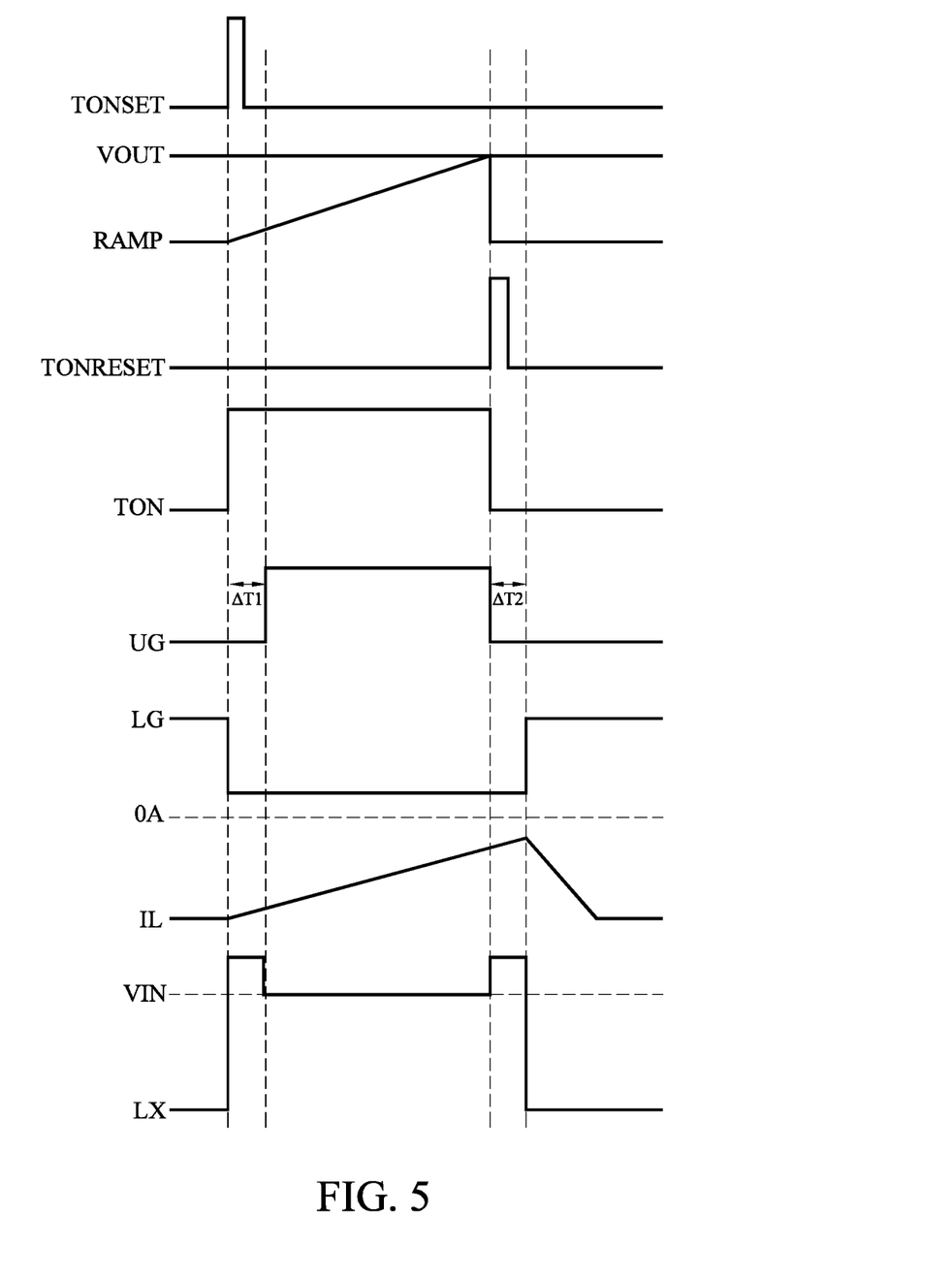
FIG. 5 is a waveform diagram showing the operation of the frequency compensation circuit in FIG. 4.

The operation of the compensation circuit 20 when the voltage at the node LX is larger than the input voltage VIN of the DC voltage converter is described as follows as shown in FIG. 1, FIG. 4 and FIG. 5.

Within the dead time ΔT1, the lower-side switch LG is turned off but the upper-side switch UG has not yet turned on. In this case, when the voltage at the node LX is larger than the input voltage VIN of the DC voltage converter (i.e., when the current IL flowing through the inductor L is negative), the equivalent on-time ton will be counted earlier. Specifically, when the voltage at the node LX is larger than the input voltage VIN of the DC voltage converter, the second comparator COMP2 generates a signal at high level. When the dead time ΔT1 begins, a control voltage of the lower-side switch LG varies from a high voltage to a low voltage, such that the second trigger circuit T2 generates a pulse. Due to this pulse, the AND gate AND1 outputs a signal at high level and the OR gate OR outputs a signal at high level. According to the signal from the OR gate OR, the flip-flop F2 generates the first switching signal SW1 at low level, such that the first transistor Q1 is turned off and therefore the calculation circuit 10 generate the ramp voltage RAMP a dead time ΔT1 earlier.

Within a dead time ΔT2, the upper-side switch UG is turned off but the lower-side switch LG has not yet turned on. In this case, when the voltage at the node LX is still larger than the input voltage VIN of the DC voltage converter (i.e., when the current IL flowing through the inductor L is still negative), the equivalent on-time will end earlier. Specifically, when the voltage at the node LX is larger than the input voltage VIN of the DC voltage converter, the second comparator COMP2 generates a signal at high level. When the dead time ΔT2 begins, a control voltage of the upper-side switch UG varies from a high voltage to a low voltage, such that the third trigger circuit T3 generates a pulse. Due to this pulse, the AND gate AND2 outputs a signal at high level. According to the signal from the AND gate AND2, the flip-flop F3 generates the second switching signal SW2 at low level, such that the second transistor Q2 is turned off. At the same time, the first capacitor C1 has been charged by the input voltage VIN, and the voltage at the node LX is raised due to the second resistor R2, so that the ramp voltage RAMP achieves the output voltage of the DC voltage converter earlier and the equivalent on-time ton ends earlier. It is worth mentioning that, in the frequency compensation circuit in FIG. 3 and FIG. 4, the product of the resistance of the second resistor R2 and the capacitance of the first capacitor C1 is equal to a time segment (i.e., the dead time ΔT2) during which the upper-side switch UG of the DC voltage converter is turned off but the lower-side switch LG of the DC voltage converter has not yet been turned on. Due to this design, the ramp voltage RAMP can achieve the output voltage VOUT of the DC voltage converter a dead time ΔT2 earlier, and further descriptions are as follows.

In operations of the frequency compensation circuit in FIG. 3 and FIG. 4, when the current IL flowing through the inductor L is entirely negative, the equivalent on-time ton can be represented by Equation 1 as follows.

$$ton = \frac{[(VOUT - V_{R2}) \times C1]}{I1} + \Delta T2 \qquad \text{Equation 1}$$

In the Equation 1, "ton" is the equivalent on-time of the DC voltage converter, "VOUT" is the output voltage of the DC voltage converter, "$V_{R2}$" is the voltage drop caused by the second resistor R2, "C1" is the first capacitor, "I1" is the current provided to the first capacitor C1, and "ΔT2" is time segment during which the upper-side switch UG of the DC voltage converter is turned off but the lower-side switch LG of the DC voltage converter has not yet been turned on.

The above "$V_{R2}$" and "I1" can be represented respectively by Equation 2 and Equation 3 as follows, wherein "VIN" is the input voltage of the DC voltage converter.

$$V_{R2} = VIN \times \left(\frac{R2}{R1}\right) \qquad \text{Equation 2}$$

$$I1 = \frac{VIN}{R1} \qquad \text{Equation 3}$$

Based on the Equation 2 and the Equation 3, the Equation 1 can be transformed to Equation 4 as follows.

$$ton = \frac{VOUT \times R1 \times C1}{VIN} - R2 \times C1 + \Delta T2 \qquad \text{Equation 4}$$

According to the Equation 4, the dead time ΔT2 can be cancelled out when R2×C1=ΔT2. After the first capacitor C1 is charged by the input voltage VIN, the voltage at the node LX is raised due to the second resistor R2, so that the ramp voltage RAMP achieves the output voltage of the DC voltage converter a dead time ΔT2 earlier. As a result, the calculation circuit 10 generates the control signal a dead time ΔT2 earlier, such that the frequency compensation circuit generates the constant on-time signal TON a dead time ΔT2 earlier.

In conclusion, in the case shown by FIG. 2B, the calculation circuit 10 can generate the ramp voltage RAMP a dead time ΔT1 earlier, such that the equivalent on-time ton can be counted earlier. Moreover, in the case shown by FIG. 2C, the calculation circuit 10 can generate the ramp voltage RAMP a dead time ΔT1 earlier, such that the equivalent on-time ton can be counted earlier, and also, the ramp voltage RAMP generated by the calculation circuit 10 can achieve the output voltage VOUT of the DC voltage converter a dead time ΔT2 earlier, such that the equivalent on-time ton ends earlier. Therefore, due to the operation of the frequency compensation circuit of the present disclosure, the switching frequency of the upper-side switch and the lower-side switch of a DC voltage converter can be maintained.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A frequency compensation circuit, generating a constant on-time signal to a DC voltage converter to maintain switching frequencies of an upper-side switch and a lower-side switch of the DC voltage converter, comprising:
a calculation circuit, coupled to the DC voltage converter, generating a ramp voltage, and generating a control signal according to the ramp voltage and an output voltage of the DC voltage converter, such that the constant on-time signal is generated according to the control signal; and
a compensation circuit, coupled to the calculation circuit and the DC voltage converter, detecting the voltage at a node between the upper-side switch and the lower-side switch of the DC voltage converter, and controlling the calculation circuit to generate the ramp voltage according to an input voltage of the DC voltage converter and the voltage at the node;
wherein the compensation circuit controls the calculation circuit to generate the ramp voltage when the voltage at the node is larger than the input voltage of the DC voltage converter, the calculation circuit generates the control signal at low level when the ramp voltage is smaller than the output voltage of the DC voltage converter so that the frequency compensation circuit generates the constant on-time signal at high level, and the calculation circuit generates the control signal at high level when the ramp voltage is larger than or equal to the output voltage of the DC voltage converter so that the frequency compensation circuit generates the constant on-time signal at low level.

2. The frequency compensation circuit according to claim 1, wherein when the voltage at the node is smaller than or equal to the input voltage of the DC voltage converter, according to turning on and turning off of the upper-side switch and the lower-side switch of the DC voltage converter, the compensation circuit controls the calculation circuit to generate the ramp voltage.

3. The frequency compensation circuit according to claim 1, wherein the calculation circuit includes:
a first resistor, wherein one end of the first resistor receives the input voltage of the DC voltage converter;
a first comparator, wherein a non-inverting input end of the first comparator is coupled to the other end of the first resistor, an inverting input end of the first comparator receives the output voltage of the DC voltage converter, and an output end of the first comparator outputs the control signal; and
a first capacitor, wherein one end of the first capacitor is coupled to the other end of the first resistor, and the other end of the first capacitor is grounded.

4. The frequency compensation circuit according to claim 3, wherein the compensation circuit includes:
a second resistor, coupled between the first resistor and the first capacitor;
wherein the product of the resistance of the second resistor and the capacitance of the first capacitor is equal to a time segment during which the upper-side switch of the DC voltage converter is turned off but the lower-side switch of the DC voltage converter has not yet been turned on.

5. The frequency compensation circuit according to claim 4, wherein the compensation circuit further includes:
a first transistor, wherein a first end of the first transistor is coupled to the non-inverting input end of the first comparator, and a second end of the first transistor is grounded;
a second transistor, wherein a first end of the second transistor is coupled to the non-inverting input end of the first comparator, and a second end of the second transistor is coupled between the second resistor and the first capacitor; and
a first logic circuit and a second logic circuit, wherein according to the input voltage of the DC voltage converter and the voltage at the node, the first logic circuit generates a first switching signal and the second logic circuit generates a second switching signal;
wherein a control end of the first transistor receives the first switching signal, a control end of the second transistor receives the second switching signal, and the ramp voltage generated by the calculation circuit is controlled according to the turning on and turning off of the upper-side switch and the lower-side switch of the DC voltage converter.

6. The frequency compensation circuit according to claim 5, wherein the first logic circuit includes:
a flip-flop, wherein an output pin of the flip-flop is coupled to the control end of the first transistor, and a set pin of the flip-flop receives a set signal;
an OR gate, wherein an output end of the OR gate is coupled to a reset pin of the flip-flop, and one input end of the OR gate is coupled to a first trigger circuit; and
an AND gate, wherein an output end of the AND gate is coupled to the other input end of the OR gate, one input end of the AND gate is coupled to a second trigger circuit, and the other input end of the AND gate is coupled to an output end of a second comparator;
wherein the first trigger circuit generates a pulse when a control voltage of the upper-side switch varies from a low voltage to a high voltage, the second trigger circuit generates a pulse when a control voltage of the lower-side switch varies from a high voltage to a low voltage, an inverting input end of the second comparator receives the input voltage of the DC voltage converter, and a non-inverting input end of the second comparator receives the voltage at the node.

7. The frequency compensation circuit according to claim 6, wherein the second logic circuit includes:
a flip-flop, wherein an output pin of the flip-flop is coupled to the control end of the second transistor through an inverter, and a reset pin of the flip-flop receives a reset signal;
an AND gate, wherein an output end of the AND gate is coupled to a set pin of the flip-flop, one input end of the AND gate is coupled to a third trigger circuit, and the other input end of the AND gate is coupled to an output end of a second comparator;
wherein the third trigger circuit generates a pulse when a control voltage of the upper-side switch varies from a high voltage to a low voltage, the inverting input end of the second comparator receives the input voltage of the DC voltage converter, and the non-inverting input end of the second comparator receives the voltage at the node.

8. The frequency compensation circuit according to claim 7, wherein if the voltage at the node is smaller than or equal to the input voltage of the DC voltage converter, when the control voltage of the upper-side switch varies from a low voltage to a high voltage, the first transistor is turned off due to the pulse generated by the first trigger circuit, such that the calculation circuit starts to generate the ramp voltage.

9. The frequency compensation circuit according to claim 7, wherein if the voltage at the node is larger than the input voltage of the DC voltage converter, when the control voltage of the lower-side switch varies from a high voltage to a low voltage, the OR gate outputs a signal at high level due to the pulse generated by the second trigger circuit and thus the first transistor is turned off, such that the calculation circuit generates the ramp voltage early.

10. The frequency compensation circuit according to claim 7, wherein if the voltage at the node is larger than the input voltage of the DC voltage converter, when the control voltage of the upper-side switch varies from a high voltage to a low voltage, the second transistor is turned off due to a signal at high level outputted by the AND gate, such that the ramp voltage generated by the calculation circuit achieves the output voltage of the DC voltage converter earlier.

\* \* \* \* \*